(12) United States Patent
Ji et al.

(10) Patent No.: US 8,331,649 B2
(45) Date of Patent: Dec. 11, 2012

(54) LED TESTING APPARATUS AND TESTING METHOD THEREOF

(75) Inventors: Won Soo Ji, Gyunggi-do (KR); Wook Hee Lee, Gyunggi-do (KR); Ho Young Song, Gyunggi-do (KR); Chong Wook Cho, Gyunggi-do (KR); Sung Jae Kim, Gyunggi-do (KR); Young Su Yun, Gyunggi-do (KR); Hong Min Kim, Gyunggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 341 days.

(21) Appl. No.: 12/630,448

(22) Filed: Dec. 3, 2009

(65) Prior Publication Data

US 2010/0246936 A1 Sep. 30, 2010

(51) Int. Cl.
*G06K 9/00* (2006.01)
(52) U.S. Cl. .................................... 382/149; 382/141
(58) Field of Classification Search .......... 382/141–149; 356/237.1–237.5, 417, 402, 416; 250/461.1, 250/458.1
See application file for complete search history.

(56) References Cited

U.S. PATENT DOCUMENTS

| 2008/0137106 A1 | 6/2008 | Ono |
| 2009/0136120 A1 | 5/2009 | Onushkin et al. |

FOREIGN PATENT DOCUMENTS

| CN | 101202322 A | 6/2008 |
| JP | 02-017433 | 1/1990 |
| JP | 06-308043 | 11/1994 |
| JP | 2005-172584 | 6/2005 |
| JP | 2006-133052 | 5/2006 |
| JP | 2006-162427 | 6/2006 |
| JP | 2007-024510 | 2/2007 |
| JP | 2007-285985 | 11/2007 |
| JP | 2007-292576 | 11/2007 |
| JP | 2008-267926 | 11/2008 |
| JP | 2009-103512 | 5/2009 |
| JP | 2009-156872 | 7/2009 |
| JP | 2009-158903 | 7/2009 |
| JP | 2009-175150 | 8/2009 |

OTHER PUBLICATIONS

Japanese Office Action, with English Translation, issued in Japanese Patent Application No. 2009-275869, dated Jan. 31, 2012.
European Search Report issued in European Patent Application No. EP 09177905.8 dated May 12, 2010.
Chinese Office Action, and English translation thereof, issued in Chinese Patent Application No. 200910252848.2 dated Aug. 31, 2012.

*Primary Examiner* — Tri T Ton
(74) *Attorney, Agent, or Firm* — McDermott Will & Emery LLP

(57) ABSTRACT

There is provided an LED testing apparatus. An LED testing apparatus according to an aspect of the invention may include: a first lighting unit generating first light and irradiating the first light onto an LED having an encapsulant including a fluorescent material excited by the first light to emit light having a longer wavelength than the first light; a second lighting unit generating second light having a longer wavelength than the first light to irradiate the second light onto the LED; an image acquisition unit receiving the light emitted from the fluorescent material and the second light reflected off the LED to acquire images of the LED; and an LED state determination unit determining whether the LED is acceptable or defective using the images of the LED acquired by the image acquisition unit.

19 Claims, 6 Drawing Sheets

LED TESTING APPARATUS AND TESTING METHOD THEREOF

BACKGROUND OF THE INVENTION

1. Field of the Invention

The present invention relates to an LED testing apparatus and a method thereof that can be applied to backlights or lighting devices, and more particularly, to an LED testing apparatus and a method thereof that can ensure the reliability of LED tests by automatically performing a test to determine whether an LED is acceptable or defective, using visible rays or ultraviolet rays.

2. Description of the Related Art

In general, light emitting diodes (LEDs) refer to semiconductor devices that emit light of various colors by configuring light sources by altering the compound semiconductor material, such as GaAs, AlGaAs, GaN or InGaInP.

High-brightness, high-quality LED products rather than general-purpose, low-brightness LED products can be manufactured in line with the rapid progress in semiconductor technology. Furthermore, thanks to the realization of blue and white LEDs having excellent properties, the application range of these LEDs has been expanded to next-generation light sources and displays. Among these various LEDS, white LEDs will now be described with reference to FIG. 1.

FIG. 1 is a cross-sectional view illustrating the configuration of a white LED according to the related art.

In a white LED, shown in FIG. 1, according to the related art, lead frames 20, consisting of first and second lead frames 21 and 22, are formed on the inner bottom of a bucket 10 that may be formed of a synthetic plastic resin. A blue LED 30 is mounted and connected to the first lead frame 21, while a diode 40 is mounted and connected to the second lead frame 22. The blue LED 30 and the diode 40 are electrically connected to each other through a bonding wire 50.

Here, in order to emit white light using a blue LED and a yellow phosphor, a blue LED chip package is filled with an encapsulant 60, formed of silicone resin mixed with a yellow phosphor. That is, the inside of the bucket 10 is coated with the encapsulant 60, which contains the yellow phosphor, so that blue light, emitted from the blue LED 30, changes into white light by the yellow phosphor in the encapsulant 60.

Recently, in order to complement green and red light-emitting areas, a green or blue phosphor as well as the yellow phosphor may be added to the encapsulant 60.

In the process of manufacturing the white LED according to the related art, the amount of the encapsulant filling in the package is as important as a ratio of mixing the silicon resin and the yellow phosphor. The encapsulant is supplied using a dispensing device. When the encapsulant is supplied, the bucket may not be coated with the encapsulant since the encapsulant is not properly supplied, or may overflow due to the excessive supply of the encapsulant. The ingress of foreign substances or damage to the bucket may also occur in the process of supplying the encapsulant. Since these defects cause a deterioration of the white LED, a test to determine whether the white LED is acceptable or defective is necessary in the manufacturing process.

However, the test to determine whether a white LED is acceptable or defective is being performed with the naked eye.

As for the test with the unaided eye, objective test criteria is ambiguous among inspectors, and the reliability of test results is reduced due to the difference in detection ability between skilled and unskilled inspectors.

SUMMARY OF THE INVENTION

An aspect of the present invention provides an LED testing apparatus and a method thereof that can ensure the reliability of LED tests by automatically performing a test to determine whether an LED is acceptable or defective, using visible rays or ultraviolet rays.

According to an aspect of the present invention, there is provided an LED testing apparatus including: a first lighting unit generating first light and irradiating the first light onto an LED having an encapsulant including a fluorescent material excited by the first light to emit light having a longer wavelength than the first light; a second lighting unit generating second light having a longer wavelength than the first light to irradiate the second light onto the LED; an image acquisition unit receiving the light emitted from the fluorescent material and the second light reflected off the LED to acquire images of the LED; and an LED state determination unit determining whether the LED is acceptable or defective using the images of the LED acquired by the image acquisition unit.

The first light may be an ultraviolet ray, and the second light may be a visible ray.

The LED testing apparatus may further include a beam splitter reflecting the first light emitted from the first lighting unit to supply the reflected light to the LED, and transmitting the light emitted from the LED.

The LED testing apparatus may further include a color filter arranged in an optical path of the light emitted from the LED, transmitting the light emitted from the fluorescent material and blocking light having a different wavelength.

The first lighting unit may be switched on when the second lighting unit is switched off, and the second lighting unit may be switched on when the first lighting unit is switched off.

The first lighting unit may be switched on when the second lighting unit is switched off, and the second lighting unit may be switched on when the first lighting unit is switched off.

The color filter may be located in a filtering region set beforehand when the first lighting unit is switched on, and be located in a region other than the filtering region set beforehand when the second lighting is switched on.

The image acquisition unit may acquire a first LED image using the light emitted from the fluorescent material and a second LED image using the second light reflected off the LED, and the LED state determination unit may extract a first edge line from the first LED image and a second edge line from the second LED image.

The LED state determination unit may perform mask matching by comparing the second edge line with a reference edge line of the LED to determine a size and an arrangement direction of the encapsulant are the same therebetween.

The LED state determination unit may perform defect detection to determine whether the LED is defective or not by comparing the first edge line with the second edge line.

The LED state determination unit may determine at least one LED defect among overflowing of the encapsulant, uncoating of the encapsulant, a foreign substance included in the encapsulant and damage.

The fluorescent material may be a yellow phosphor.

According to an aspect of the present invention, there is provided an LED testing method including: performing an image acquisition operation to acquire a first LED image of an LED, coated with an encapsulant having a fluorescent material excited by an ultraviolet ray to emit light having a longer wavelength than the ultraviolet ray, by irradiating an ultraviolet ray onto the LED and using light emitted from the fluorescent material, and a second LED image of the LED by irradiating visible light onto the LED and using the visible light reflected off the LED; and performing an LED state determination operation to determine whether the LED is defective or not using the first and second LED images.

The LED state determination operation may include extracting first and second edge lines from the first and second LED images, respectively, and determining whether the LED is defective or not using the first and second edge lines.

During the LED state determination operation, mask matching may be performed by comparing the second edge line with a reference edge line of the LED to determine whether a size and an arrangement direction of the encapsulant are the same therebetween.

During the LED state determination operation, overflow detection may be performed by comparing the first edge line with the second edge line of the LED to determine whether the encapsulant of the LED overflows.

During the LED state determination operation, uncoating detection may be performed by comparing the first edge line with the second edge line to determine whether the LED is coated with the encapsulant or not.

During the LED state determination operation, foreign substance detection may be performed to determine whether a foreign substance is present in the encapsulant of the LED by comparing the first edge line with the second edge line. 18.

During the LED state determination operation, damage detection may be performed using the second edge line to determine whether the LED is damaged.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
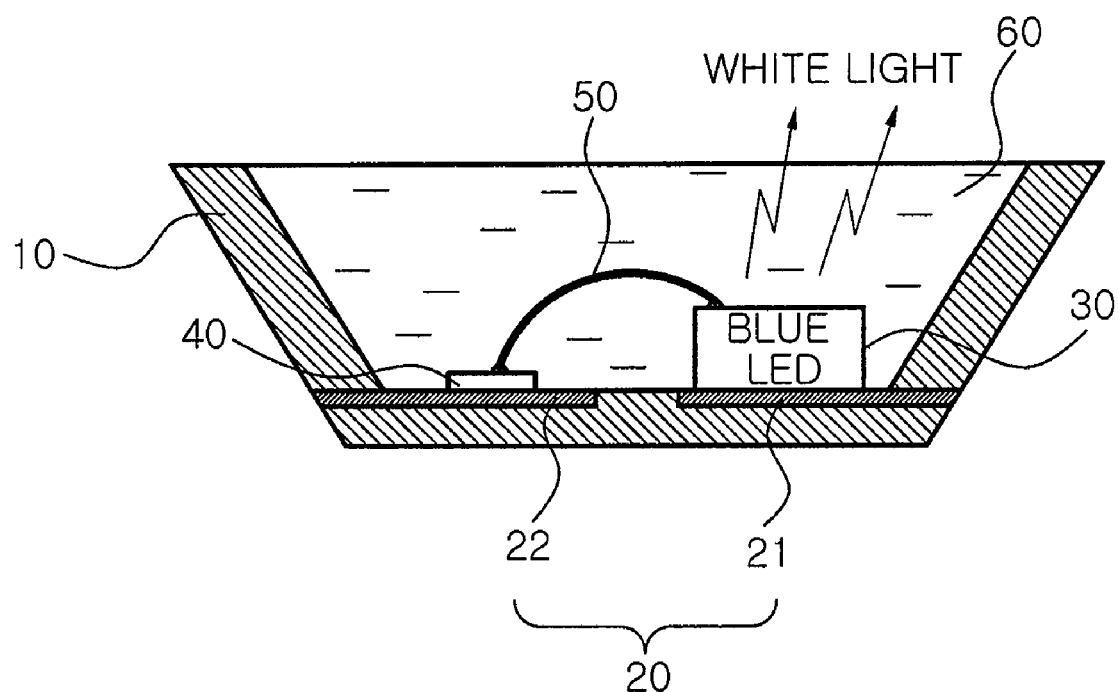
FIG. 1 is a cross-sectional view illustrating the configuration of a white LED according to the related art.

Exemplary embodiments of the present invention will now be described in detail with reference to the accompanying drawings.

The invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the same reference numerals will be used throughout to designate the components having substantially the same configuration and function.

Figure 2:
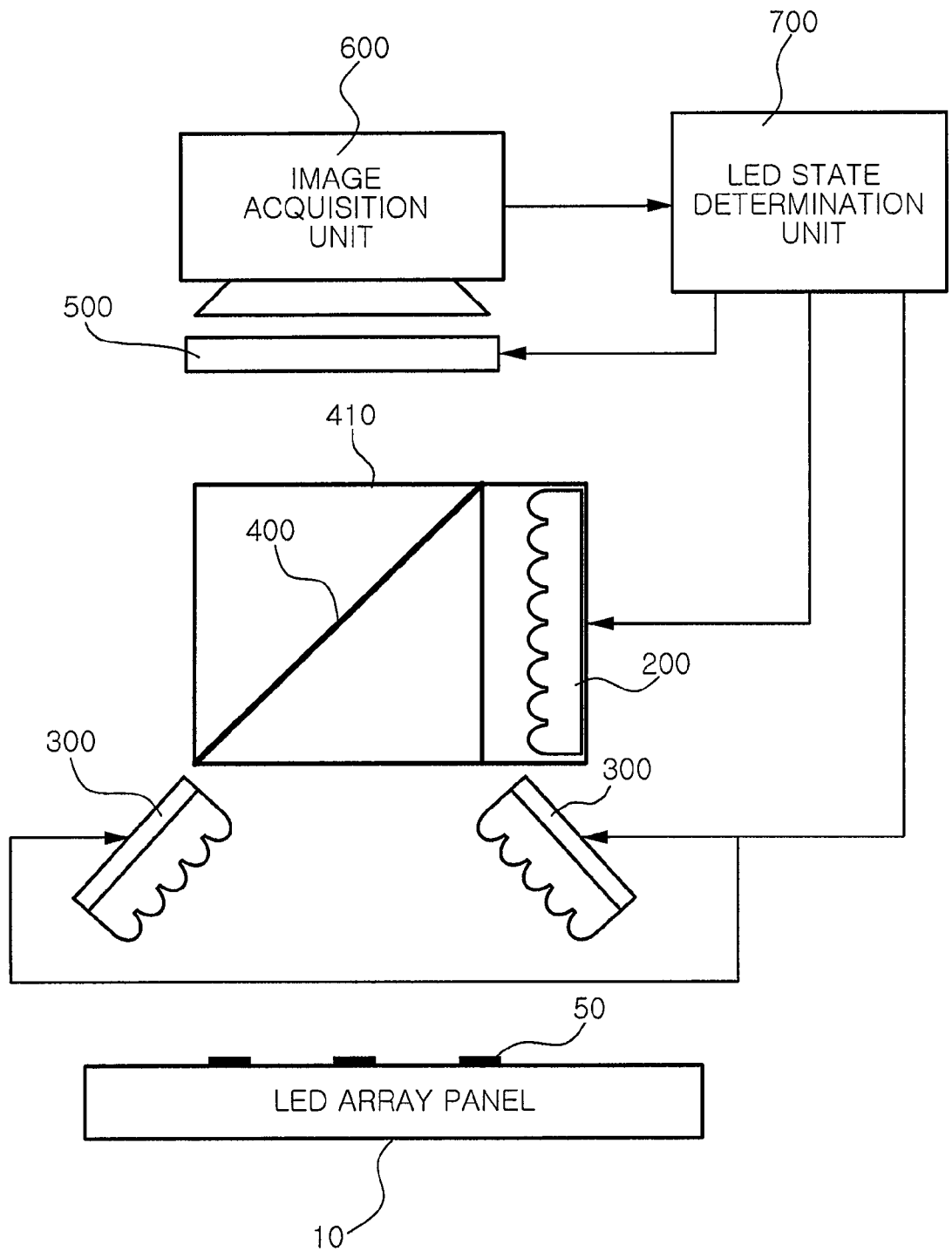
FIG. 2 is a block diagram illustrating the configuration of an LED testing apparatus according to an exemplary embodiment of the present invention.

FIG. 2 is a block diagram illustrating the configuration of an LED testing apparatus according to an exemplary embodiment of the invention.

Referring to FIG. 2, an LED testing apparatus according to this embodiment has a first lighting unit 200, a second lighting unit 300, a color filter 500, an image acquisition unit 600, and an LED state determination unit 700. The first lighting unit 200 generates first light and supplies the first light to an LED 50 coated with an encapsulant containing a fluorescent material having a predetermined color. The second lighting unit 300 generates second light and supplies the second light to the LED 50. The color filter 500 transmits light, having a predetermined wavelength, from light emitted from the LED 50. The image acquisition unit 600 receives the light, having passed through the color filter 500, and acquires an image of the LED 50. The LED state determination unit 700 determines whether the LED is acceptable or defective, using the image of the LED acquired by the image acquisition unit 600.

One of the first light and the second light may be ultraviolet rays, and the other may be visible rays. For example, the first lighting unit 200 may generate ultraviolet rays as first light, while the second lighting unit 300 may generate visible rays as second light.

Here, the LED testing apparatus according to this embodiment may include a beam splitter 400 that reflects the first light from the first lighting unit 200 to supply the reflected first light to the LED 50, and transmits light, reflected against the LED 50. Here, reference numeral 410 denotes a support body that holds the beam splitter 400.

The image acquisition unit 600 may acquire a first LED image using the first light of the first lighting unit 200 and a second LED image using the second light of the second lighting unit 300.

The first lighting unit 200 may be switched on when the second lighting unit 300 is switched off. The second lighting unit 300 may be switched on when the first lighting unit 200 is switched on.

These operations of the first lighting unit 200 and the second lighting unit 300 may be controlled by the LED state determination unit 700 or an additional control unit.

The LED 50 according to this embodiment may be a white LED coated with an encapsulant having a yellow phosphor. Here, when a yellow filter is employed in the color filter 500, yellow light, generated from the encapsulant of the LED 50, can pass through the image acquisition unit 600 by the ultraviolet rays, which are the first light of the first lighting unit 200.

The color filter 500 is positioned in a filtering region, set beforehand, when the first lighting unit 200 is switched on. Here, if the ultraviolet rays from the first lighting unit 200 do not pass through the encapsulant of the LED 50 and are combined with the yellow phosphor of the encapsulant of the LED 50, yellow light is generated. The yellow light from the encapsulant passes through the image acquisition unit 600 via the color filter 500.

On the other hand, the color filter 500 is positioned in a region other than the filtering region, set beforehand, when the second lighting unit 300 is turned on. Here, the visible rays from the second lighting unit 300 pass through the encapsulant of the LED 50 and reflect from the bottom, the blue LED chip and the encapsulant of the LED 50. Light reflecting from the LED 50 is transmitted to the image acquisition unit 600 without passing through the color filter 500.

The LED state determination unit 700 may extract a first edge line from the first LED image and a second edge line from the second LED image. The following items may be tested using the first and second edge lines and a reference edge line.

First, the LED state determination unit 700 may perform mask matching to determine by comparing the second edge line with the reference edge line set beforehand, whether a size and an arrangement direction of encapsulant are the same therebetween.

Further, the LED state determination unit 700 compares the first edge line and/or the second edge line with each other to perform detect inspection to determine whether the LED 50 is defective or not.

For example, the LED state determination unit 700 can determine at least one of the following defects: overflowing of the encapsulant, uncoating of the encapsulant, foreign substances present in the encapsulant, and damage, on the basis of the defect of the LED 50.

Figure 3:
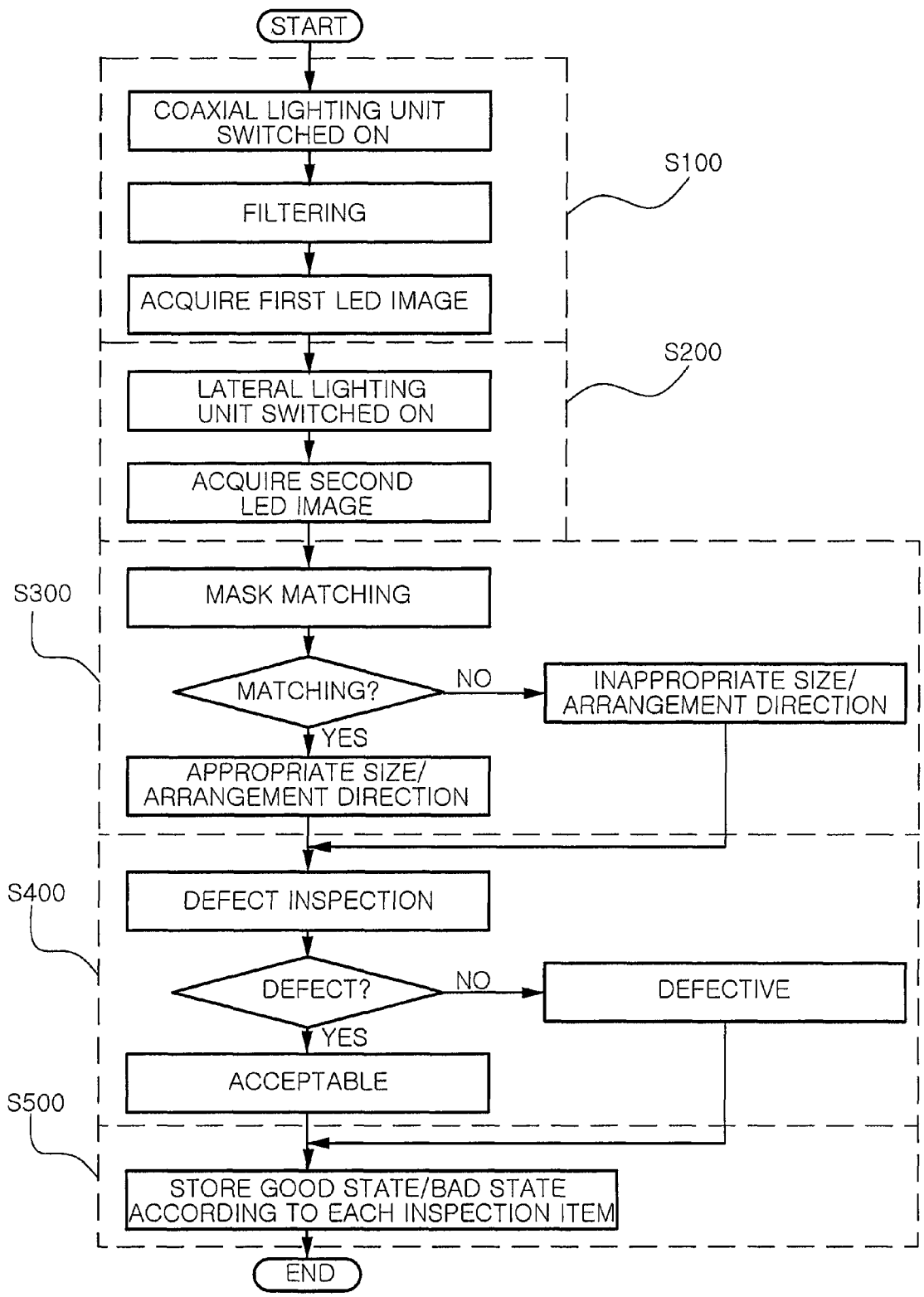
FIG. 3 is a flowchart illustrating an LED testing method according to an exemplary embodiment of the present invention.

FIG. 3 is a flowchart illustrating an LED testing method according to an exemplary embodiment of the invention.

Referring to FIGS. 2 and 3, according to an LED testing method according to this embodiment, a first LED image of the LED 50 coated with an encapsulant containing a fluorescent material having a predetermined color is acquired using ultraviolet rays, and a second LED image is acquired using visible rays in operations S100 and S200, mask matching is performed to determine by using the second LED image and a reference image set beforehand, whether a size and an arrangement direction of the encapsulant are the same therebetween in operation S300, and defect inspection is performed using the first LED image and/or the second LED image to determine whether the LED 50 is defective or not in operation S400.

According to the LED testing method according to this embodiment, after performing the mask matching and the defect inspection in operations S300 and S400, test results according to inspection items, that is, good and bad states, may further be stored in operation S500.

During the mask matching in operation S300, first and second edge lines can be extracted from the first and second LED images, respectively. This process of extracting edge lines will be described with reference to FIG. 4.

Figure 4:
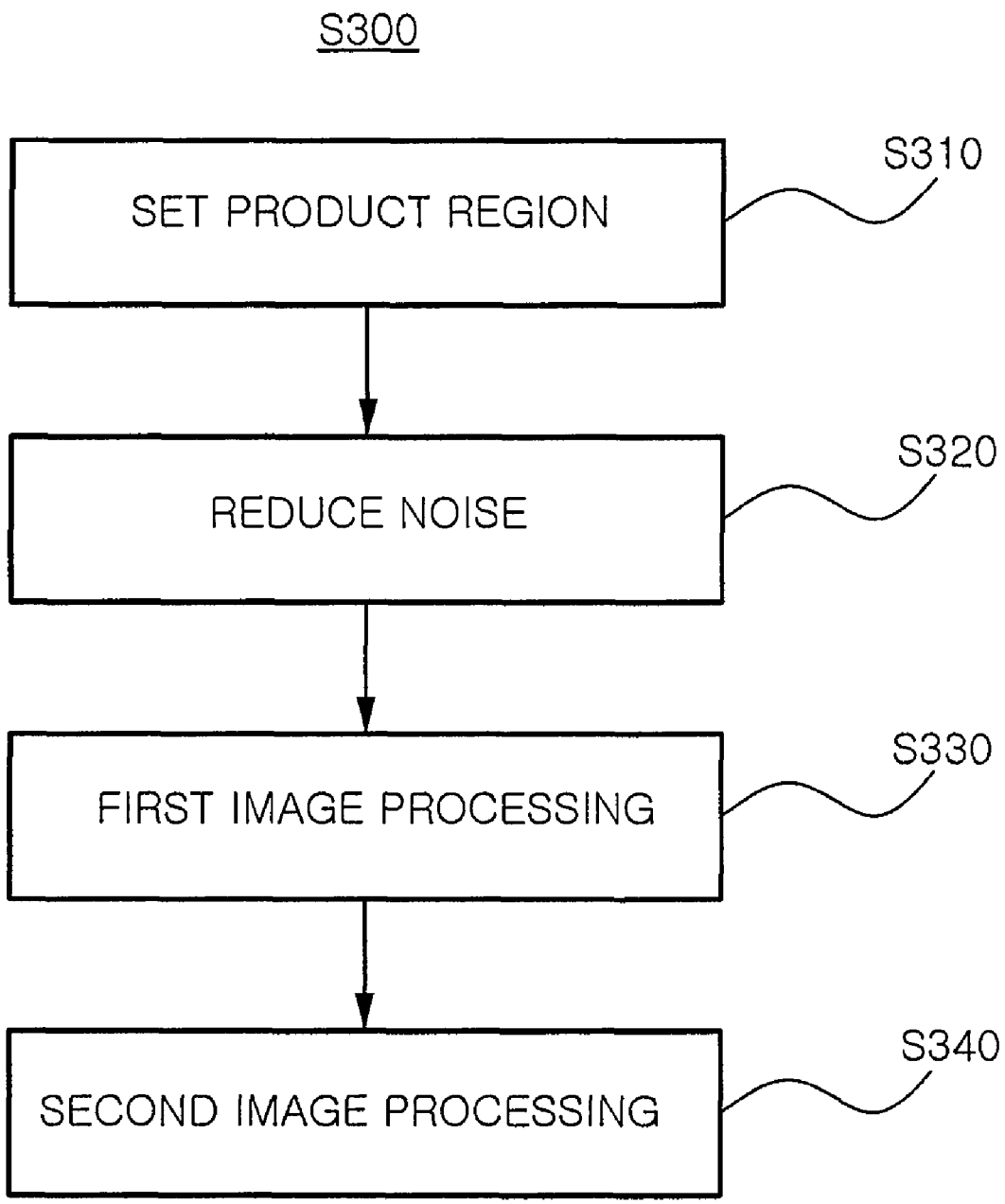
FIG. 4 is a flowchart illustrating an edge line extraction operation according to an exemplary embodiment of the present invention.

FIG. 4 is a flowchart an edge line extraction operation according to an exemplary embodiment of the invention.

Since a plurality of LEDs 50 are included in an LED array panel 10, shown in FIG. 2, each of the first and second LED images includes a plurality LED images. Thus, referring to FIG. 4, a region with respect to one LED image is set for each of the first and second LED images in operation S310, noise in the LED image is reduced in operation S320, first image processing, called tracing, is performed, and second image processing, called threshold, is then performed.

Through this edge line extraction process, a first edge line and a second edge line can be obtained from the first LED image and the second LED image, respectively.

Referring to FIGS. 2 through 4, during the mask matching in operation S300, it is determined by the second edge line and a reference edge line of a reference image, whether a size and an arrangement direction of the encapsulant are the same therebetween.

The defect inspection in operation S400 is performed to determine whether the LED 50 is defective or not using the first edge line and/or the second edge line.

Specifically, the defect inspection in operation S400 may include an overflow detection process to determine whether the encapsulant of the LED 50 overflows by comparing the first edge line and the second edge line; an uncoating detection process to determine using the first LED image and the second LED image, whether the LED 50 is coated with the encapsulant or not; a foreign substance detection process to determine whether foreign substances are present in the encapsulant of the LED 50 by comparing the first edge line with the second edge line; and a damage detection process to determine whether the LED 50 is damaged using the second edge line.

The LED 50 according to this embodiment may be a white LED coated with an encapsulant containing a yellow phosphor. Here, in the above-described image acquisition process, the first LED image may be acquired by filtering yellow light created from the encapsulant of the LED 50 using ultraviolet rays, that is, the first light of the first lighting unit 200.

FIGS. 5A through 5D are examples showing images according to defect types.

Figure 5A:
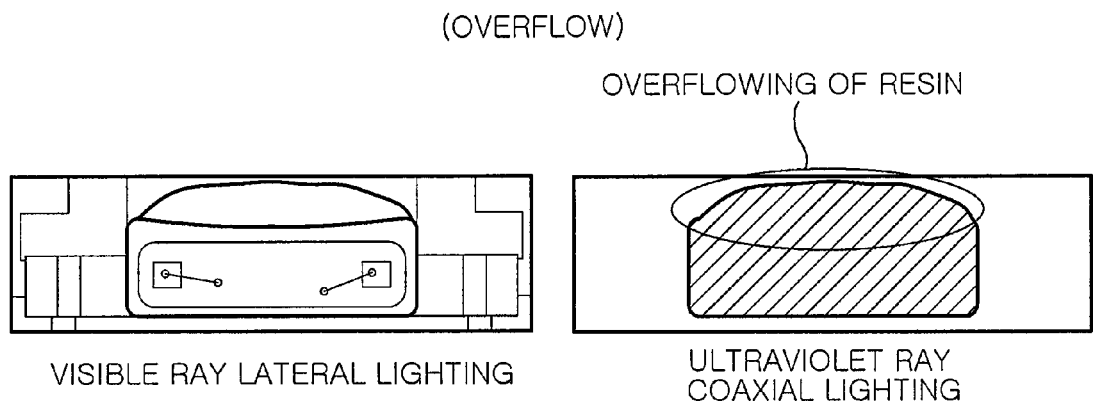
FIGS. 5A through 5D are views illustrating examples according to defect types.
Figure 5B:
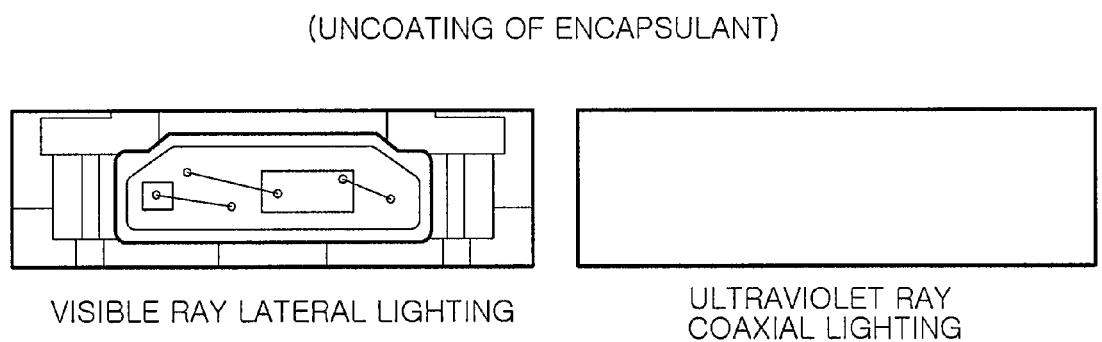
Figure 5C:
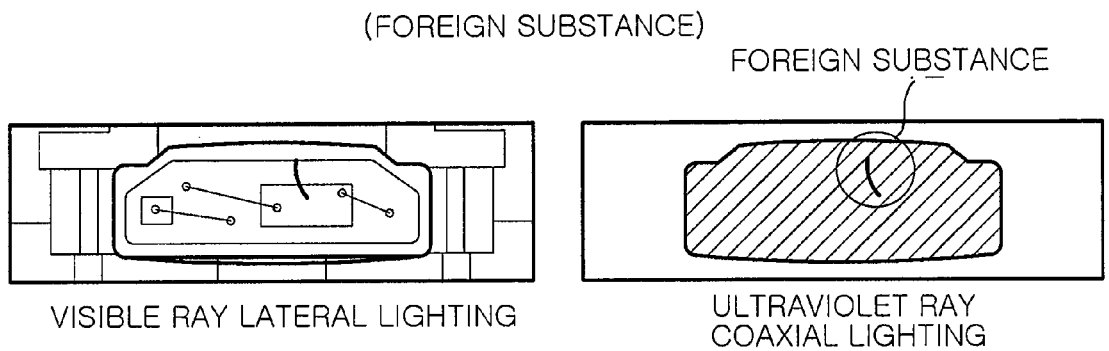
Figure 5D:
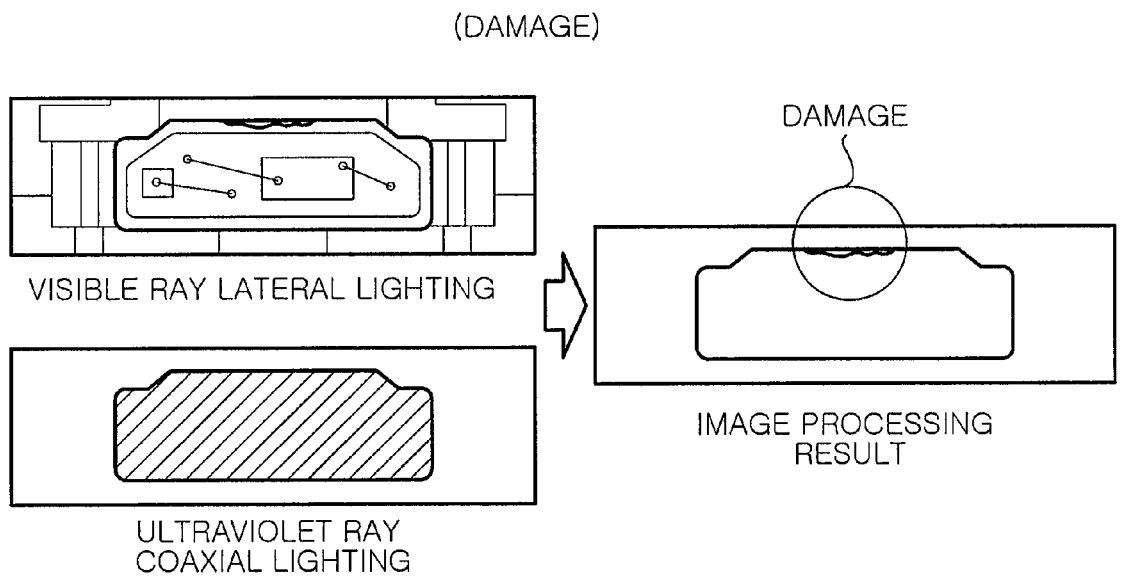

FIG. 5A shows an image corresponding to overflowing of an encapsulant among LED defects according to this embodiment. FIG. 5B shows an image corresponding to uncoating of an encapsulant among LED defects according to this embodiment. FIG. 5C shows an image corresponding to ingress of foreign substances among LED defects according to this embodiment. FIG. 5D shows an image corresponding to damage among LED defects according to this embodiment.

Further, in FIGS. 5A, 5B, 5C and 5D, a second LED image, obtained using visible rays, is shown on the left, and a first LED image, obtained using ultraviolet rays, is shown on the right.

Hereinafter, the operation and effect of the invention will be described with reference to the accompanying drawings.

An LED testing apparatus according to an exemplary embodiment of the invention will now be described with reference to FIG. 2. In this embodiment, the first lighting unit 200 generates and supplies ultraviolet rays as first light, and the second lighting unit 300 generates and supplies visible rays as second light.

First, the ultraviolet rays from the first lighting unit 200 reflect off the beam splitter 400 and are supplied to the LEDs 50 of the LED array panel 10. Here, when the LED 50 is a white LED having a yellow phosphor, a yellow light is emitted due to the yellow phosphor contained in the encapsulant of the LED 50.

The color filter 500 according to this embodiment is positioned in a filtering region set beforehand when the first lighting unit 200 is switched on. Here, the yellow light from the LED 50 is input to the image acquisition unit 600 through the beam splitter 400 and the color filter 500.

Here, the image acquisition unit 600 may be a camera, and the color filter 500 corresponding to a colored fluorescent material is employed. When the colored fluorescent material is a yellow phosphor, a yellow filter may be used. The image acquisition unit 600 converts light, input through the color filter 500, into an electrical signal to acquire the first LED image.

The second lighting unit 300 according to this embodiment generates visible light as second light and supplies the visible light to the LED 50. The visible light of the second lighting unit 300 passes through the encapsulant of the LED 50 and reflects off the bottom, the blue LED chip, and the encapsulant of the LED 50.

The color filter 500 is positioned in a region other than the filtering region set beforehand when the second lighting unit 300 is switched on. Here, the visible ray, reflecting off the LED 50, does not pass through the color filter 500 and is transmitted to the image acquisition unit 600.

The image acquisition unit 600 converts the visible ray, input without passing through the color filter 500, into an electrical signal to acquire a second LED image.

Then, the LED state determination unit 700 according to this embodiment determines whether an LED is in a good state or a bad state using LED images from the image acquisition unit 600, which will now be described in detail.

The LED state determination unit 700 extracts the first edge line from the first LED image and the second edge line from the second LED image.

First, the LED state determination unit 700 performs mask matching to determine by comparing the second edge line with the reference edge line set beforehand, whether the size and the arrangement direction of the encapsulant are the same therebetween. For example, by comparing the second edge line with the reference edge line set beforehand, if the second edge line and the reference edge line coincide with each other, it is determined that the size and the arrangement direction of the encapsulant are the same therebetween, and otherwise, it is determined that the size and the arrangement direction of the encapsulant are not the same therebetween.

The LED state determination unit 700 may perform defect inspection to determine whether the LED 50 is defective by comparing the first edge line and/or the second edge line.

Here, the LED state determination unit 700 may determine at least one of the following defects, which may occur in the LED 50: overflowing of the encapsulant, uncoating of the encapsulant, foreign substances present in the encapsulant, and damage.

An LED testing method according to this embodiment will now be described with reference to FIGS. 2 through 5.

First, the image acquisition process in operations S100 and S200 in the LED testing method according to the embodiment, shown in FIG. 3, the first LED image of the LED 50 coated with the encapsulant, containing the fluorescent material having a predetermined color, is acquired using the ultraviolet ray and the second LED image of the LED 50 is acquired using the visible ray.

The LED 50 according to this embodiment may be a white LED coated with an encapsulant containing a yellow phosphor. During the image acquisition process, yellow light created from the encapsulant of the LED 50 is filtered using the ultraviolet ray, which is the first light of the first lighting unit 200, thereby acquiring to acquire the first LED image.

Here, since the operations performed until the first LED image and the second LED image are acquired is the same as those described with reference to FIG. 2, a description thereof will be omitted.

When the mask matching is performed in operation S300, it is determined using the second LED image and the reference image set beforehand, whether the size and arrangement direction of the encapsulant are the same therebetween.

Here, during the mask matching in operation S300, first and second edge lines are extracted from the first and second LED images, respectively. This process of extracting edge lines will be described with reference to FIG. 4.

Referring to FIG. 4, since a plurality of LEDs 50 are included in an LED array panel 10, each of the first and second LED images includes a plurality LED images. Thus, a region with respect to one LED image is set for each of the first and second LED images in operation S310, noise in the LED image is reduced in operation S320, first image processing, called tracing, is performed, and second image processing, called threshold, is then performed.

By performing the first and second image processing, the first edge line and the second edge line can be obtained from the first LED image and the second LED image, respectively.

Referring to FIGS. 2 through 4, during the mask matching in operation S300, the second edge line and the reference edge line of the predetermined reference image are compared with each other to determine whether the size and arrangement direction of the encapsulant are the same therebetween.

When the defect inspection is performed in operation S400, it is determined using the first LED image and/or the second LED image whether the LED 50 is defective. Specifically, during the defect inspection in operation S400, it is determined whether the LED 50 is defective, using the first and second edge lines extracted from the first and second LED images, respectively, and the reference edge line.

The above-described defect inspection according to defect type may include overflow detection, uncoating detection, foreign substance detection and damage detection.

During the overflow detection, it is determined whether the encapsulant of the LED 50 overflows by comparing the first edge line with the second edge line. For example, as shown in FIG. 5A, when an overflow of an encapsulant occurs, double or multiple lines appear on the first edge line. As a result, the first edge line and the second edge line do not coincide with each other.

During the uncoating detection, it is determined whether the LED 50 is coated with the encapsulant or not by using the first edge line and the second edge line. For example, as shown in FIG. 5B, the first edge line appears distinct, while the second edge line is not detected.

During the foreign substance detection, it is determined whether foreign substances are present in the encapsulant of the LED 50 by comparing the first edge line with the second edge line. For example, as shown in FIG. 5C, while the first edge line and the second edge line do not coincide with each other, an edge line corresponding to a foreign substance is shown within a region inside the outline of the first edge line.

During the damage detection, it is determined using the second edge line whether the LED 50 is defective. For example, as shown in FIG. 5D, the second edge line is partially damaged.

After performing above-described processes, test results according to inspection items, that is, good and bad states, obtained in operations S300 and S400, may be stored in operation S500.

As described above, according to the LED testing apparatus and the LED testing method according to the embodiments of the invention, LED images are acquired using ultraviolet ray lighting and visible ray lighting, and defects in the LED can be automatically tested comprehensively using edge lines extracted from the acquired LED images, thereby ensuring high reliability of LED testing results.

As set forth above, according to exemplary embodiments of the invention, a test can be automatically performed using visible and ultraviolet rays to determine whether an LED is defective or not, so that the reliability of LED tests can be ensured.

While the present invention has been shown and described in connection with the exemplary embodiments, it will be apparent to those skilled in the art that modifications and variations can be made without departing from the spirit and scope of the invention as defined by the appended claims.

What is claimed is:

1. An LED testing apparatus comprising:
   a first lighting unit generating first light and irradiating the first light onto an LED having an encapsulant including a fluorescent material excited by the first light to emit light having a longer wavelength than the first light;
   a second lighting unit generating second light having a longer wavelength than the first light to irradiate the second light onto the LED;

an image acquisition unit receiving the light emitted from the fluorescent material and the second light reflected off the LED to acquire images of the LED; and an LED state determination unit determining whether the LED is acceptable or defective using the images of the LED acquired by the image acquisition unit.

2. The LED testing apparatus of claim 1, wherein the first light is an ultraviolet ray, and the second light is a visible ray.

3. The LED testing apparatus of claim 1, further comprising a beam splitter reflecting the first light emitted from the first lighting unit to supply the reflected light to the LED, and transmitting the light emitted from the LED.

4. The LED testing apparatus of claim 1, further comprising a color filter arranged in an optical path of the light emitted from the LED, transmitting the light emitted from the fluorescent material and blocking light having a different wavelength.

5. The LED testing apparatus of claim 1, wherein the first lighting unit is switched on when the second lighting unit is switched off, and the second lighting unit is switched on when the first lighting unit is switched off.

6. The LED testing apparatus of claim 4, wherein the first lighting unit is switched on when the second lighting unit is switched off, and the second lighting unit is switched on when the first lighting unit is switched off.

7. The LED testing apparatus of claim 6, wherein the color filter is located in a filtering region set beforehand when the first lighting unit is switched on, and is located in a region other than the filtering region set beforehand when the second lighting unit is switched on.

8. The LED testing apparatus of claim 1, wherein the image acquisition unit acquires a first LED image using the light emitted from the fluorescent material and a second LED image using the second light reflected off the LED, and the LED state determination unit extracts a first edge line from the first LED image and a second edge line from the second LED image.

9. The LED testing apparatus of claim 8, wherein the LED state determination unit performs mask matching by comparing the second edge line with a reference edge line of the LED to determine a size and an arrangement direction of the encapsulant are the same therebetween.

10. The LED testing apparatus of claim 8, wherein the LED state determination unit performs defect detection to determine whether the LED is defective or not by comparing the first edge line with the second edge line.

11. The LED testing apparatus of claim 10, wherein the LED state determination unit determines at least one LED defect among overflowing of the encapsulant, uncoating of the encapsulant, a foreign substance included in the encapsulant and damage.

12. The LED testing apparatus of claim 1, wherein the fluorescent material is a yellow phosphor.

13. An LED testing method comprising:

performing an image acquisition operation to acquire a first LED image of an LED, coated with an encapsulant having a fluorescent material excited by an ultraviolet ray to emit light having a longer wavelength than the ultraviolet ray, by irradiating an ultraviolet ray onto the LED and using light emitted from the fluorescent material, and a second LED image of the LED by irradiating visible light onto the LED and using the visible light reflected off the LED; and performing an LED state determination operation to determine whether the LED is defective or not using the first and second LED images.

14. The LED testing method of claim 13, wherein the LED state determination operation comprises extracting first and second edge lines from the first and second LED images, respectively, and determining whether the LED is defective or not using the first and second edge lines.

15. The LED testing method of claim 14, wherein during the LED state determination operation, mask matching is performed by comparing the second edge line with a reference edge line of the LED to determine whether a size and an arrangement direction of the encapsulant are the same therebetween.

16. The LED testing method of claim 14, wherein during the LED state determination operation, overflow detection is performed by comparing the first edge line with the second edge line to determine whether the encapsulant of the LED overflows.

17. The LED testing method of claim 14, wherein during the LED state determination operation, uncoating detection is performed by comparing the first edge line with the second edge line to determine whether the LED is coated with the encapsulant or not.

18. The LED testing method of claim 14, wherein during the LED state determination operation, foreign substance detection is performed to determine whether a foreign substance is present in the encapsulant of the LED by comparing the first edge line with the second edge line. 18.

19. The LED testing method of claim 14, wherein during the LED state determination operation, damage detection is performed using the second edge line to determine whether the LED is damage.

* * * * *